(12) United States Patent
Iwasawa et al.

(10) Patent No.: US 9,246,337 B2
(45) Date of Patent: Jan. 26, 2016

(54) BATTERY PACK AND BATTERY PACK CONTROLLER

(75) Inventors: Hiroshi Iwasawa, Hitachinaka (JP);
Akihiko Emori, Hitachi (JP); Yutaka Kobayashi, Hitachinaka (JP); Ko Takahashi, Tokyo (JP); Akihiko Kanouda, Hitachinaka (JP)

(73) Assignee: HITACHI, LTD., Tokyo (JP)

( * ) Notice: Subject to any disclaimer, the term of this patent is extended or adjusted under 35 U.S.C. 154(b) by 615 days.

(21) Appl. No.: 13/642,741

(22) PCT Filed: Apr. 23, 2010

(86) PCT No.: PCT/JP2010/057251
§ 371 (c)(1),
(2), (4) Date: Dec. 13, 2012

(87) PCT Pub. No.: WO2011/132311
PCT Pub. Date: Oct. 27, 2011

(65) Prior Publication Data
US 2013/0088201 A1  Apr. 11, 2013

(51) Int. Cl.
*H02J 7/00* (2006.01)
*H01M 10/44* (2006.01)
*H01M 10/48* (2006.01)
*G01R 31/36* (2006.01)
*H01M 10/42* (2006.01)

(52) U.S. Cl.
CPC .............. *H02J 7/00* (2013.01); *G01R 31/3679* (2013.01); *H01M 10/441* (2013.01); *H01M 10/482* (2013.01); *H02J 7/0016* (2013.01); *H02J 7/0019* (2013.01); *H02J 7/0026* (2013.01); *G01R 31/362* (2013.01); *G01R 31/3658* (2013.01); *H01M 2010/4271* (2013.01); *Y02T 10/7055* (2013.01)

(58) Field of Classification Search
USPC .................................. 320/118; 324/426, 434
See application file for complete search history.

(56) References Cited

U.S. PATENT DOCUMENTS

| | | | |
|---|---|---|---|
| 6,262,494 B1 | 7/2001 | Tsukuni et al. | |
| 2004/0001996 A1 | 1/2004 | Sugimoto | |
| 2004/0239333 A1* | 12/2004 | Kikuchi | 324/434 |
| 2008/0204031 A1* | 8/2008 | Iwane et al. | 324/430 |
| 2009/0023053 A1 | 1/2009 | Berdichevsky et al. | |
| 2010/0065349 A1* | 3/2010 | Ichikawa et al. | 180/65.1 |

FOREIGN PATENT DOCUMENTS

| | | | |
|---|---|---|---|
| JP | 62-092732 A | 4/1987 | |
| JP | 09-107075 A | 4/1997 | |
| JP | 10-197613 A | 7/1998 | |
| JP | 11-273747 A | 10/1999 | |

(Continued)

*Primary Examiner* — Samuel Berhanu
(74) *Attorney, Agent, or Firm* — Volpe and Koenig, P.C.

(57) ABSTRACT

A battery pack includes a plurality of battery units mutually connected in parallel, each including a cell group in which one or two or more secondary cells are connected in series, and a first current control element that is connected in series with this cell group, a first control means that controls the charging/discharging current for each battery unit by controlling the operation of the first current control element included in each of the battery unit; a voltage measurement means that measures the voltage of the cell group or cells included in each of the battery unit, and a diagnosis means that diagnoses a deterioration level or a fault of each battery unit on the basis of the voltage of the cell group or cells measured by the voltage measurement means.

14 Claims, 11 Drawing Sheets

(56) References Cited

FOREIGN PATENT DOCUMENTS

| JP | 2000-012104 | A | 1/2000 |
| JP | 2004-312863 | A | 11/2004 |
| JP | 4019815 | B2 | 10/2007 |
| JP | 2009-022099 | A | 1/2009 |

* cited by examiner

BATTERY PACK AND BATTERY PACK CONTROLLER

TECHNICAL FIELD

The present invention relates to a battery pack that is made up from a plurality of secondary cells, and to a controller therefor.

BACKGROUND ART

Prior art battery packs such as disclosed in Patent Document #1 are per se known for use as secondary cell systems for which high capacity is required, such as systems for electric automobiles, railroad engines, power storage systems for electrical power systems, and so on. These battery packs include series cell groups in which a large number of secondary cells are connected in series, and are made by connecting a plurality of these series cell groups in parallel.

On the other hand, in Patent Document #2, for a battery pack in which a plurality of blocks are connected in series, with a plurality of secondary cells being connected in parallel in each parallel block, it is proposed to detect the amount of change of the voltage of each parallel block before and after charging and discharging, and to determine the presence or absence of faulty cells on the basis of the results of detection.

CITATION LIST

Patent Literature

Patent Document #1: Japanese Laid-Open Patent Publication No. 2004-312863
Patent Document #1: Japanese Patent No. 4,019,815.

SUMMARY OF THE INVENTION

Technical Problem

With a prior art battery pack such as those as described above, it has been difficult to perform diagnosis accurately of deterioration level and of any fault of each cell group while charging and discharging of the entire battery pack is being performed. In other words while, in order accurately to diagnose the deterioration level and any fault by units of cell group, it is necessary to intercept the charging/discharging current to that cell group, with the battery pack disclosed in Patent Document #1, since each one of the series cell groups comprises a large number of secondary cells connected in series, when the charging/discharging current to that cell group is intercepted, the charging/discharging capability of the battery pack as a whole is greatly decreased. Furthermore, with the battery pack disclosed in Patent Document #2, since the parallel blocks that are equivalent to cell groups are connected in series, it is not possible to intercept the charging/discharging current by units of cell groups. Accordingly, it has not been possible accurately to perform diagnosis of deterioration level or faults for each cell group while charging/discharging of the battery pack as a whole is being performed.

The present invention has been made in consideration of the above points, and its object is to supply a battery pack with which it is possible to perform diagnosis of deterioration level or faults for each battery unit, while charging/discharging of the battery pack as a whole is being performed.

Solution to Problem

A battery pack according to a first aspect of the present invention comprises: a plurality of battery units mutually connected in parallel, each including a cell group in which one or two or more secondary cells are connected in series, and a first current control element that is connected in series with the cell group; a first control means that controls the charging/discharging current for each battery unit by controlling the operation of the first current control element included in each of the battery unit; a voltage measurement means that measures the voltage of the cell group or cells included in each of the battery unit; and a diagnosis means that diagnoses a deterioration level or a fault of each battery unit on the basis of the voltage of the cell group or cells measured by the voltage measurement means.

According to a second aspect of the present invention, in the battery pack of the first aspect, it is acceptable that the diagnosis means calculates the DC internal resistance value of each battery unit on the basis of the voltage of the cell group or cells measured by the voltage measurement means when the first control means turns the first current control element on and the charging/discharging current is flowing, and on the basis of the voltage of the cell group or cells measured by the voltage measurement means when the first control means turns the first current control element off and intercepts the charging/discharging current, and thereby diagnoses the deterioration level of each battery unit on the basis of the results of this calculation.

According to a third aspect of the present invention, in the battery pack of the second aspect, it is preferred that: the first control means selects a partial battery unit from among the plurality of battery units, and, in the state in which the charging/discharging current is flowing through each of the battery units other than the selected battery unit, flows and intercepts the charging/discharging current through the selected battery unit; and the diagnosis means diagnoses the deterioration level of the battery unit that has been selected by the first control means.

According to a fourth aspect of the present invention, in the battery pack of the second or third aspect, the diagnosis means may calculate the charging/discharging current on the basis of the voltage between the two ends of the first current control element that has been turned on by the first control means, and may calculate the DC internal resistance value of each battery unit using the results of this calculation.

According to a fifth aspect of the present invention, in the battery pack of the first aspect, it is acceptable that: each of the battery units further includes a second current control element and a discharge resistor for forced discharge, connected in parallel with the cell group; the battery pack further comprises a second control means that controls the operation of the second current control element possessed by each of the battery units; and the diagnosis means calculates the DC internal resistance value of each battery unit on the basis of the open circuit voltage of the cell group or cells measured by the voltage measurement means when, in the state in which the first control means turns the first current control element off and intercepts the charging/discharging current, the second control means turns the second current control element off, on the basis of the voltage under load of the cell group measured by the voltage measurement means when the second control means turns the second current control element on, and on the basis of the resistance value of the discharge resistor, and thereby diagnoses the deterioration level of each battery unit on the basis of the results of this calculation.

According to a sixth aspect of the present invention, in the battery pack of any one of the first through fifth aspects, the first control means may adjust the charging/discharging current between the battery units on the basis of the result of diagnosis of the deterioration level by the diagnosis means.

According to a seventh aspect of the present invention, in the battery pack of the first aspect, it is acceptable that the diagnosis means calculates the amount of dropping of the open circuit voltage of each battery unit on the basis of the voltage of the cell group or cells measured a plurality of times by the voltage measurement means when the first control means turns all of the first current control elements off and intercepts the charging/discharging currents, and thereby diagnoses the fault of each battery unit on the basis of the results of this calculation.

According to an eighth aspect of the present invention, in the battery pack of any one of the first through seventh aspects, it is preferred that, for a battery unit whose deterioration level diagnosed by the diagnosis means is greater than or equal to a predetermined threshold value, or for a battery unit that has been diagnosed as being faulty by the diagnosis means, the first control means turns the first current control element off and cuts it off from the subjects of charging and discharging.

According to a ninth aspect of the present invention, the battery pack of the eighth aspect may further comprise a spare battery unit that is connected in parallel with the plurality of battery units, and that has the cell group and the first current control element. In this battery pack, it is preferred that, by turning the first current control element of the spare battery unit on, the first control means incorporates the spare battery unit in the subjects of charging and discharging, instead of the battery unit that has been cut off from the subjects of charging and discharging.

According to a tenth aspect of the present invention, in the battery pack of any one of the first through ninth aspects, the first control means may control each of the first current control elements of the battery units so as to make the charging/discharging currents uniform between the battery units.

According to an eleventh aspect of the present invention, in the battery pack of the tenth aspect, it is preferred that the first control means controls the proportion of time that the first current control element of each of the battery units is turned on by using PWM control.

According to a twelfth aspect of the present invention, in the battery pack of any one of the first through eleventh aspects, it is preferred that the first current control element is built using a MOSFET that has constant current characteristic, and the charging/discharging current of the battery unit is limited by using the constant current characteristic.

A battery pack controller according to a thirteenth aspect of the present invention is a controller for a battery pack that comprises a plurality of battery units mutually connected in parallel, each including a cell group in which one or two or more secondary cells are connected in series, and a first current control element that is connected in series with the cell group, this controller comprises: a first control means that controls the charging/discharging current for each battery unit by controlling the operation of the first current control element included in each of the battery unit; a voltage measurement means that measures the voltage of the cell group or cells included in each of the battery unit; and a diagnosis means that diagnoses a deterioration level or a fault of each battery unit on the basis of the voltage of the cell group or cells measured by the voltage measurement means.

According to a fourteenth aspect of the present invention, in the battery pack controller of the thirteenth aspect, it is acceptable that the diagnosis means calculates the DC internal resistance value of each battery unit on the basis of the voltage of the cell group or cells measured by the voltage measurement means when the first control means turns the first current control element on and the charging/discharging current is flowing, and on the basis of the voltage of the cell group or cells measured by the voltage measurement means when the first control means turns the first current control element off and intercepts the charging/discharging current, and thereby diagnoses the deterioration level of each battery unit on the basis of the results of this calculation.

According to a fifteenth aspect of the present invention, in the battery pack controller of the thirteenth aspect, it is acceptable that: each of the battery units further includes a second current control element and a discharge resistor for forced discharge, connected in parallel with the cell group; the controller further comprises a second control means that controls the operation of the second current control element possessed by each of the battery units; and the diagnosis means calculates the DC internal resistance value of each battery unit on the basis of the open circuit voltage of the cell group or cells measured by the voltage measurement means when, in the state in which the first control means turns the first current control element off and intercepts the charging/discharging current, the second control means turns the second current control element off, on the basis of the voltage under load of the cell group measured by the voltage measurement means when the second control means turns the second current control element on, and on the basis of the resistance value of the discharge resistor, and thereby diagnoses the deterioration level of each battery unit on the basis of the results of this calculation.

According to a sixteenth aspect of the present invention, in the battery pack controller of the thirteenth aspect, it is acceptable that the diagnosis means calculates the amount of dropping of the open circuit voltage of each battery unit on the basis of the voltage of the cell group or cells measured a plurality of times by the voltage measurement means when the first control means turns the first current control element off and intercepts the charging/discharging current, and thereby diagnoses the fault of each battery unit on the basis of the results of this calculation.

Advantageous Effect of the Invention

According to the present invention, it is possible to perform diagnosis of deterioration level or faults for each battery unit, while charging/discharging of the battery pack as a whole is being performed.

DESCRIPTION OF THE EMBODIMENTS

Figure 1:
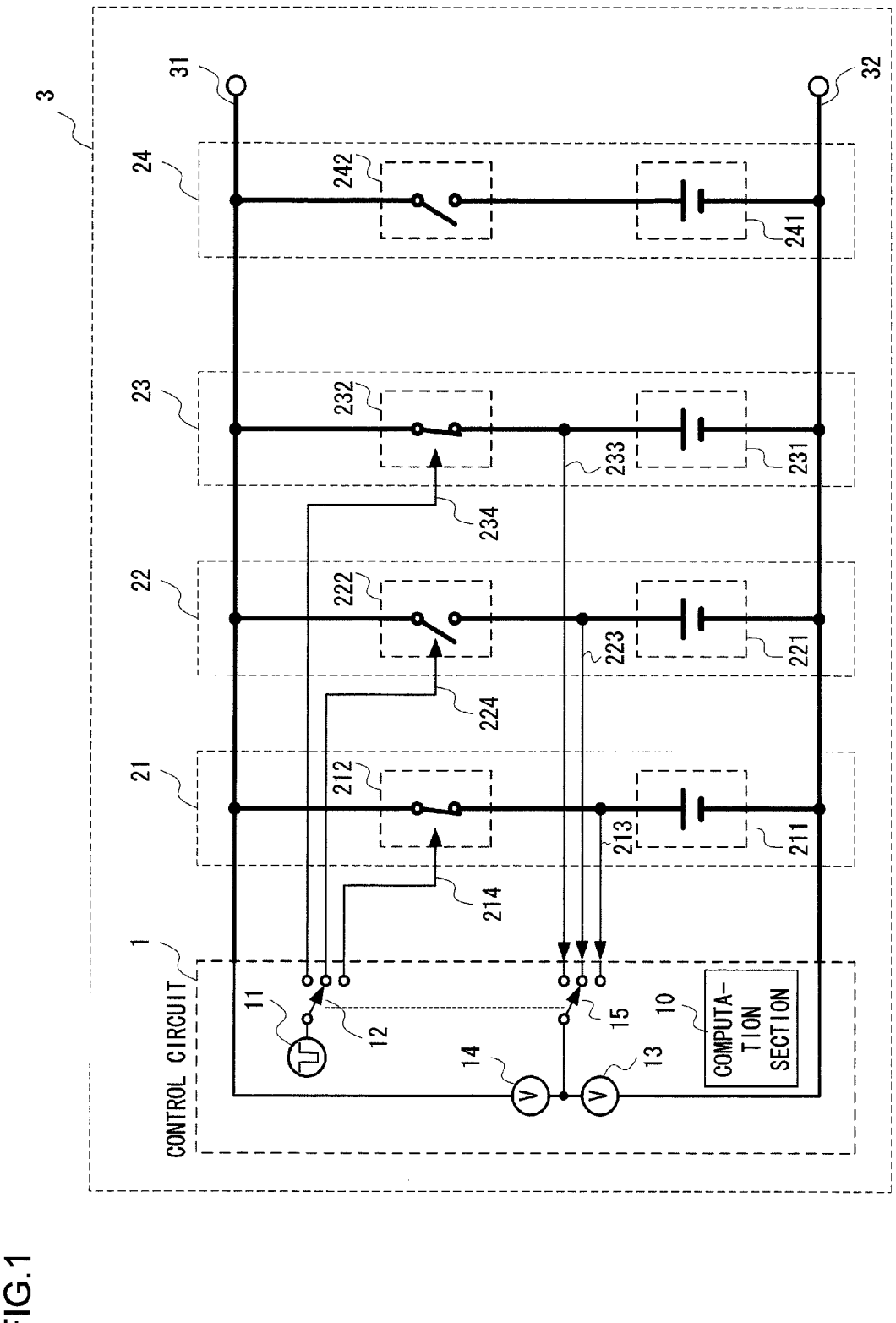
FIG. 1 is a wiring diagram showing wiring relationships in a battery pack according to a first embodiment of the present invention during deterioration diagnosis.

The battery pack according to the present invention and the controller therefor will now be explained. The battery pack according to the present invention is one that is used in a secondary battery system for an electric automobile, a railroad engine, an electrical storage system for an electrical power system, or the like, for which high capacity is required. Lithium ion cells are preferred as cells to be used in this type of high capacity secondary battery system, due to their high specific energy density and their charging and discharging efficiency and so on. Along with developments in their performance, lithium ion cells have recently become widely used in various fields.

With a lithium ion cell, as a consequence of its high specific energy density and its low internal resistance, if, when deterioration or a fault has occurred, this is neglected and charging and discharging are continued, then there is a fear that anomalous generation of heat or the like may occur. Accordingly, there is a problem with regard to ensuring security and reliability.

Even with prior art series type battery systems, there are some types in which security and reliability are ensured by cutting out a series cell group in which it has been decided that deterioration or a fault has occurred, or the like, as for example disclosed in Patent Document #1. However, since with this structure for a battery system, even if only one of the cells within a cell group has suffered deterioration or a fault, its cell group that includes a large number of good cells apart from the faulty one is cut out and cannot be used, accordingly there has been the problem that the capacity of the battery system as a whole has been remarkably decreased, and this is undesirable.

Furthermore, with a series type battery system, it has been difficult to perform diagnosis of cells, in particular diagnosis accompanied with measurement of the open circuit voltage of cells, while performing charging and discharging of the system as a whole. In other words there has been the problem that, when the number of series cell groups in parallel is limited and the charging/discharging current is intercepted even for only one series cell group among these for measurement of its open circuit voltage, then the charging and discharging capability of the system as a whole has been greatly decreased to that extent, and this is undesirable.

In order to solve the type of problem described above, the method has been considered of providing only a few cells in a cell group, and of connecting a large number of these cell groups in parallel. According to this structure, even if a bad cell is cut out, still it is possible to keep the reduction in capacity of the system as a whole to a minimum. Furthermore, it is possible to keep to a minimum the reduction in the charging and discharging capacity of the system as a whole, even if cell diagnosis is performed while performing charging and discharging of the system as a whole. However, when the cell groups are connected in parallel, the cell voltages of each of them appear to be the same, and this is undesirable since it is not possible to measure the cell voltages individually and to implement diagnosis thereof, and accordingly this expedient has not been employed in the prior art.

The present invention has been conceived in consideration of the above points. Its object is to diagnose cell deterioration or faults by units that are as small as possible. Furthermore another object of the present invention is, by performing cutting out of bad cells and deployment of spare cells, to provide a means for ensuring security and reliability of the battery pack as a whole over the long term.

With the present invention the problems described above are resolved by controlling a switch that is provided to each of the cell groups, and it is made possible to perform diagnosis at high accuracy by measuring the cell voltages individually, and it is made possible to perform detailed cutting out of bad cells and deployment of spare cells.

In concrete terms, as shown in FIG. 1, first current control elements 212, 222, and 232 are respectively connected in series with cell groups 211, 221, and 222 in each of which one cell or a few cells are connected in series, and these are taken as being battery units 21, 22, and 23 equivalent to minimum structural units. A battery module 3 of high capacity is built up by connecting a large number of these battery units 21, 22, and 23 in parallel, and by controlling them with a control circuit 1. Deterioration of the cells is diagnosed individually for each of the battery units 21, 22, and 23 by performing interception and control of the charging/discharging current using the first current control elements 212, 222, and 232 of each of these battery units 21, 22, and 23 respectively.

Figure 2:
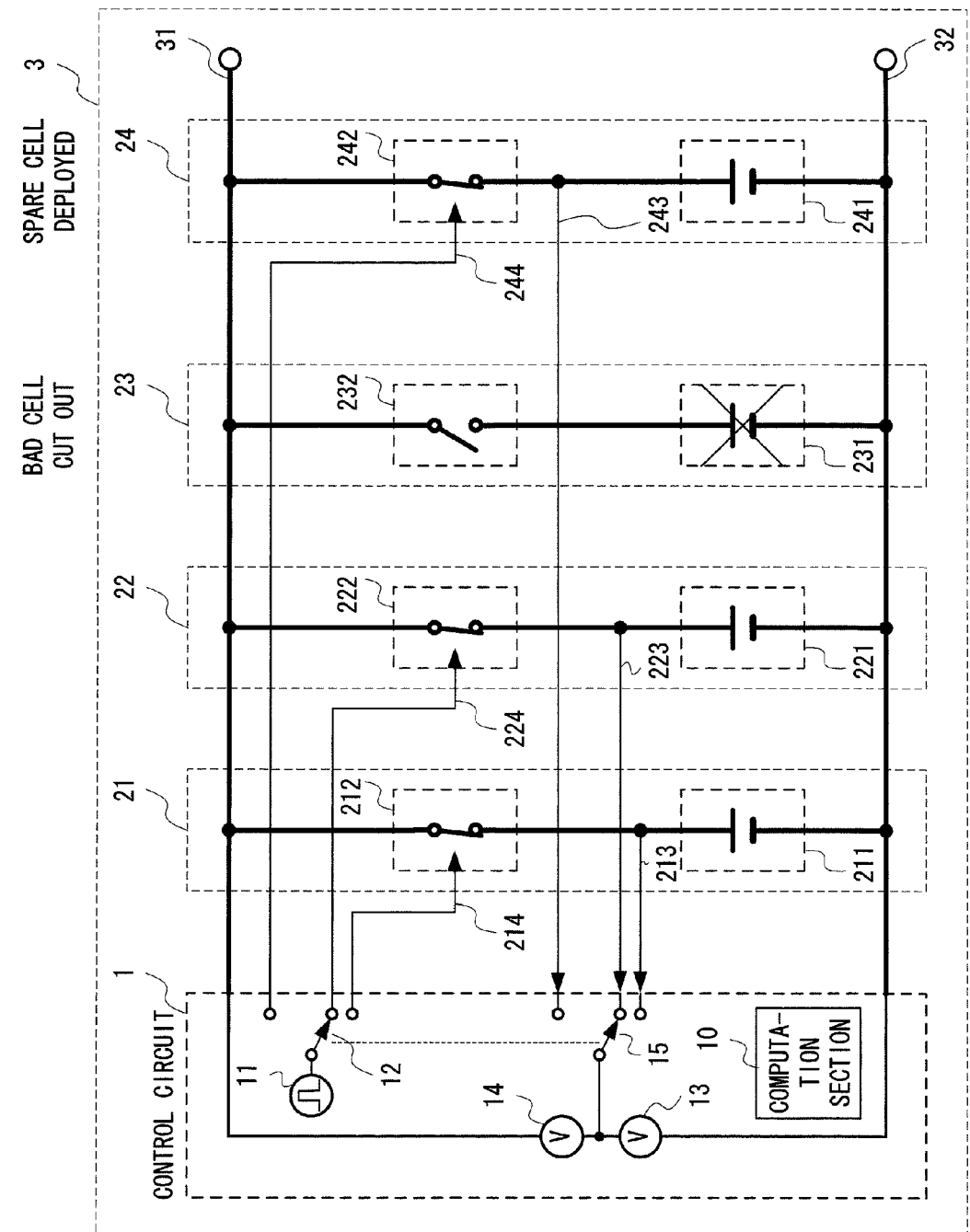
FIG. 2 is a figure showing wiring relationships in the battery pack according to the first embodiment of the present invention, when a bad battery unit has been cut out and a spare battery unit has been connected.

Furthermore, as shown in FIG. 2, the security and the reliability of the entire battery module 3 over the long term may be ensured by performing cutting out from the entire system of a battery unit 23 in which a cell has deteriorated or has suffered a fault, and by performing deployment of a spare battery unit 24 that is installed separately.

Figure 3:
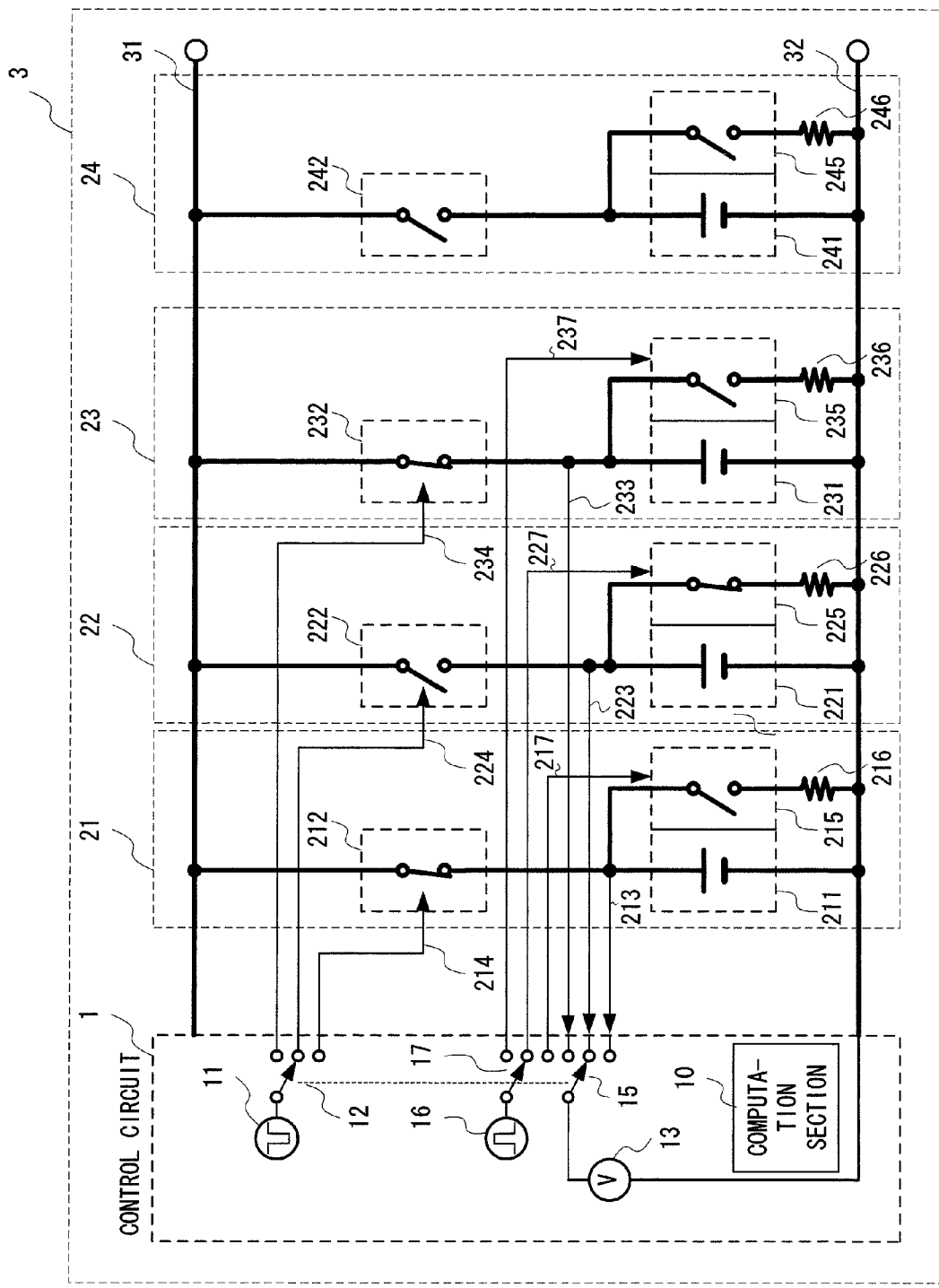
FIG. 3 is a wiring diagram showing wiring relationships in a battery pack according to a second embodiment of the present invention during deterioration diagnosis.

Furthermore, as shown in FIG. 3, in addition to the structure of FIG. 1, second current control elements 215, 225, and 235 and discharge resistors 216, 226, and 236 may be provided as connected in parallel with the cell groups 211, 221, and 231 respectively. It is possible to perform cell deterioration diagnosis and fault diagnosis for each of the battery units 21, 22, and 23 individually by performing forced electrical discharge for each of the cell groups 211, 221, and 231 respectively via the discharge resistors 216, 226, and 236.

Figure 4:
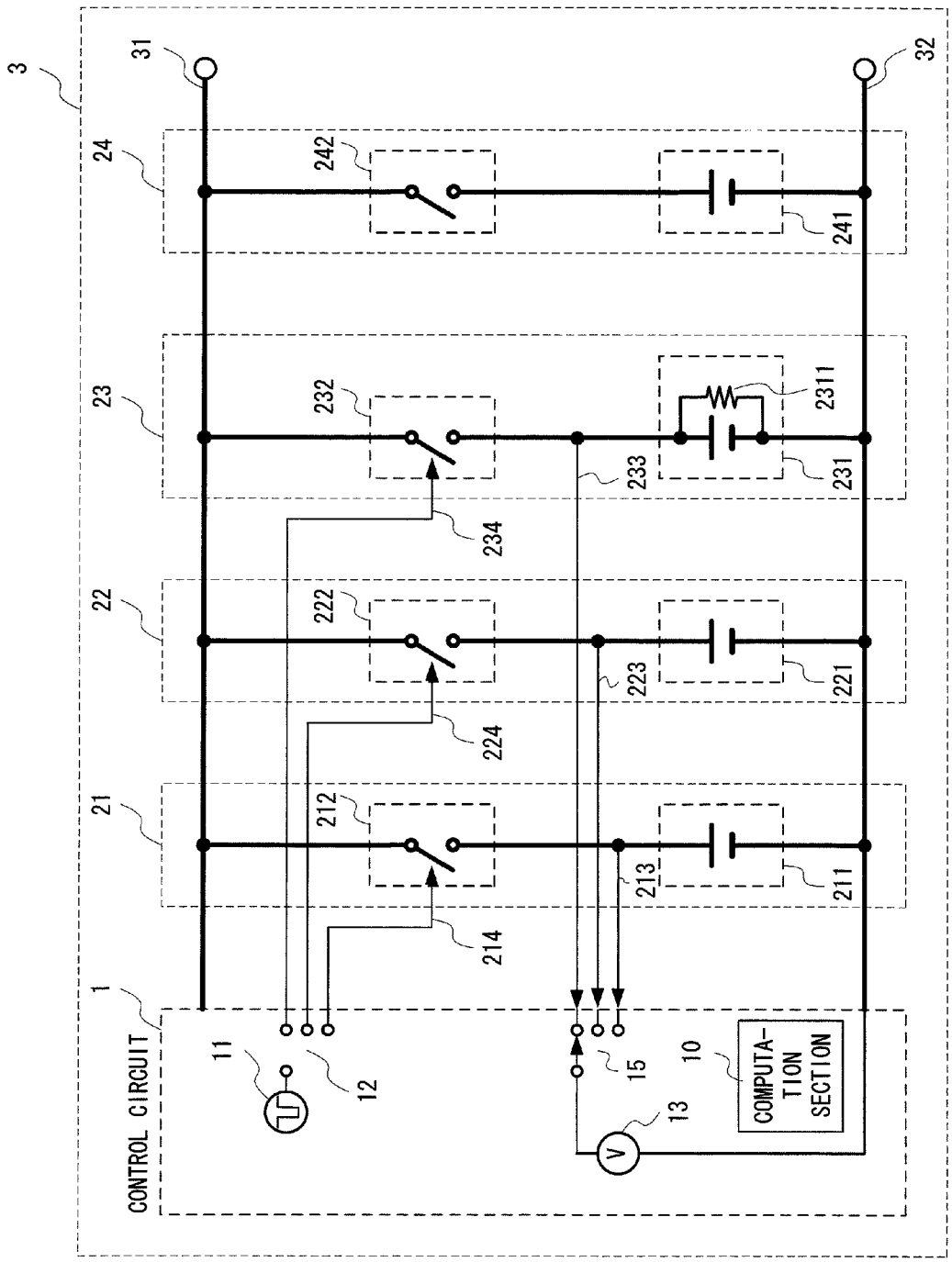
FIG. 4 is a wiring diagram showing wiring relationships in a battery pack according to a third embodiment of the present invention during fault diagnosis.

Furthermore, as shown in FIG. 4, in the state in which each of the first current control elements 212, 222, and 232 is off, the voltage of the respective cell group 211, 221, and 231 may be measured, and its change may be observed along with the passage of time. By doing this, it is possible to diagnose any fault that is due to a minute short circuit in the interior of one of the cells.

Figure 5:
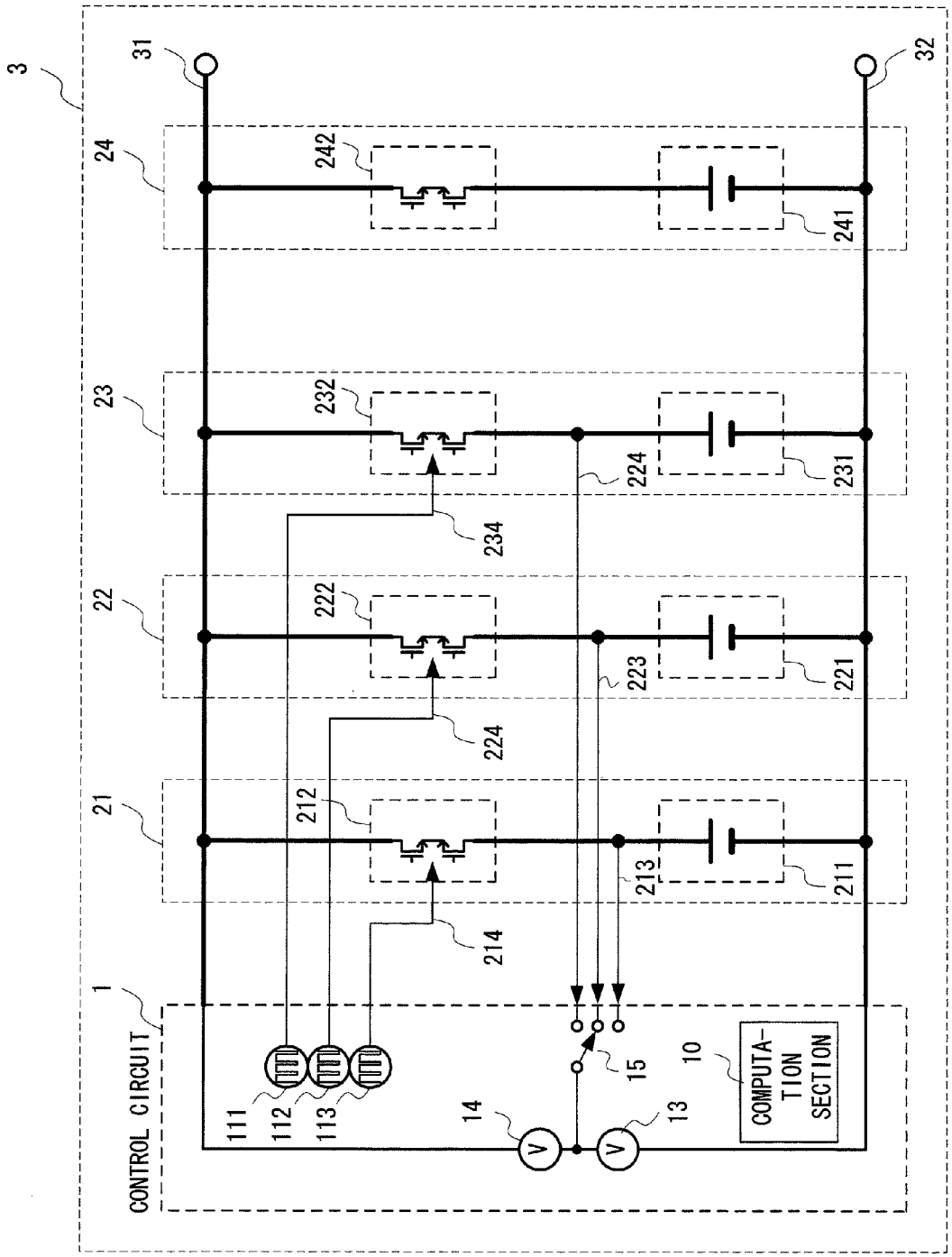
FIG. 5 is a wiring diagram showing wiring relationships in a battery pack according to a fourth embodiment of the present invention.

Furthermore, as shown in FIG. 5, PWM (Pulse Width Modulation) signals may be used for controlling the first current control elements 212, 222, and 232. By doing this, it is possible to cause equal currents to flow in each of the battery units 21, 22, and 23, and it is also possible to ensure that the current is proportionally divided between the battery units 21, 22, and 23 according to the levels of deterioration of the cell groups 211, 221, and 231.

Furthermore, a MOSFET (Metal Oxide Semiconductor Field Effect Transistor) may be used for each of the first current control elements 212, 222, and 232, and the constant current characteristic thereof may be taken advantage of. By doing this, it is possible to limit excessive currents. In particular, when reconnecting the battery units 21, 22, and 23 after having intercepted the currents through them, it is possible to limit the transient mutual currents through these battery units 21, 22, and 23.

According to the present invention, by building the battery pack as described above, when a cell has deteriorated or become faulty, it is possible to provide cell cutting out and spare cell deployment by small units (consisting of one cell or of a small number of cells). Due to this, it is possible to reduce the number of cells that become impossible to use even though they are still healthy, so that it is possible to enhance the cost efficiency while still ensuring the security and the reliability.

Furthermore, by providing first current control elements 212, 222, and 232 for each of the battery units 21, 22, and 23, it is arranged for it to be possible to perform interception and control of the charging/discharging current for each of the battery units 21, 22, and 23. Due to this, when performing charging and discharging of the battery module 3 as a whole, it is possible to perform diagnosis for a portion of the battery units accompanied with measurement of their open circuit voltages, while still continuing this charging and discharging without disturbance.

Moreover, it is possible to perform more accurate deterioration diagnosis and fault diagnosis by detecting the basic physical properties of the cells including their open circuit voltages.

Yet further, by controlling or performing current limitation of the charging/discharging current for each battery unit separately, it is possible to suppress deterioration of the cells, and to maximize their life.

The battery pack and the controller therefor according to the present invention are able to provide beneficial operational effects of various types. In the following, embodiments of the battery pack and of the controller therefor according to the present invention will be explained.

The First Embodiment

First embodiments of the battery pack according to the present invention and of the controller therefor will now be explained with reference to FIGS. 1 and 2. FIG. 1 is a wiring diagram showing the wiring relationships in a battery module 3, that is a battery pack according to this embodiment. As shown in FIG. 1, the battery module 3 comprises a control circuit 1, a plurality of battery units 21, 22, and 23, and a spare battery unit 24. The battery units 21, 22, and 23 and the spare battery unit 24 are mutually connected in parallel. Terminals at both ends of the battery units 21, 22, and 23 and of the spare battery unit 24 are connected to parallel connection wiring lines 31 and 32 of the battery module 3.

The control circuit 1 comprises a computation section 10, a signal generation circuit 11, a signal distribution circuit 12, voltage measurement circuits 13 and 14, and a changeover circuit 15. The battery units 21, 22, and 23 respectively comprise cell groups 211, 221, and 231 in which one secondary cell or a small number of secondary cells greater than or equal to two are connected in series, and first current control elements 212, 222, and 232. And, in a similar manner, the spare battery unit 24 also comprises a cell group 241 in which one secondary cell or a small number of secondary cells greater than or equal to two are connected in series, and a first current control element 242.

The computation section 10 diagnoses the respective deterioration levels of the battery units 21, 22, and 23 on the basis of the results of measurement by voltage measurement circuits 13 and 14. The method for performing this diagnosis will be explained in concrete terms hereinafter.

The signal generation circuit 11 generates signals for controlling the operation of each of the first current control elements 212, 222, and 232, and outputs them to the signal distribution circuit 12. And the signal distribution circuit 12 distributes and outputs the signals from the signal generation circuit 11 via wiring lines 214, 224, and 234 respectively, to control input terminals of the first current control elements 212, 222, and 232 respectively. Due to this operation of the signal generation circuit 11 and of the signal distribution circuit 12, the operation of each of the first current control elements 212, 222, and 232 incorporated in the battery units 21, 22, and 23 respectively is controlled, and thereby control of the charging and discharging currents of each of the battery units 21, 22, and 23 is performed.

The voltage measurement circuit 13 measures the cell voltages of each of the cell groups 211, 221, and 231 incorporated in the battery units 21, 22, and 23 respectively. On the other hand, the voltage measurement circuit 14 measures the voltage between the two ends of each of the first current control elements 212, 222, and 232 incorporated in the battery units 21, 22, and 23 respectively. The results of measurement by the voltage measurement circuits 13 and 14 are all outputted to the computation section 10, and are used for diagnosis of the deterioration levels of the battery units 21, 22, and 23.

One of the terminals of each of the voltage measurement circuits 13 and 14 is connected to the changeover circuit 15, while other terminals thereof are respectively wired to the parallel connection wiring lines 32 and 31 that are common to the entire battery module 3. The changeover circuit 15 is a circuit for changing over the subject of voltage measurement by the voltage measurement circuits 13 and 14 between the battery units 21, 22, and 23, and it is connected to wiring lines 213, 223, and 233 that are respectively connected to points between the cell groups 211, 221, and 231 and the first current control elements 212, 222, and 232. According to changing over operation by the changeover circuit 15, the voltage measurement circuit 13 measures the cell voltages of the cell groups 211, 221, and 231 via the wiring lines 213, 223, and 233 respectively. On the other hand, according to changing over operation by the changeover circuit 15, the voltage measurement circuit 14 measures the voltages between the two ends of each of the first current control elements 212, 222, and 232 via the wiring lines 213, 223, and 233 respectively.

Lithium ion cells or the like are used as the secondary cells in the cell groups 211, 221, and 231. For example, lithium ion cells of comparatively small capacity (0.5 to around 50 Ah) for which the yield rate during manufacture is high, and for which the unit price can be kept low due to the beneficial effects of mass production, or the like may be used. For example, the 18650 size and so on are per se known as small capacity lithium ion cells of this type.

The first current control elements 212, 222, and 232 are respectively connected in series with the cell groups 211, 221, and 231. The on/off operation of the first current control elements 212, 222, and 232 is controlled by the operation of the signal generation circuit 11 and the signal distribution circuit 12, as previously described. Back-to-back connected MOSFETs may, for example, be used for the first current control elements 212, 222, and 232. A back-to-back connected MOSFET is a device in which two MOSFETs are connected in series, and either their drains or their sources are connected together, and it can control current in both directions.

Figure 6:
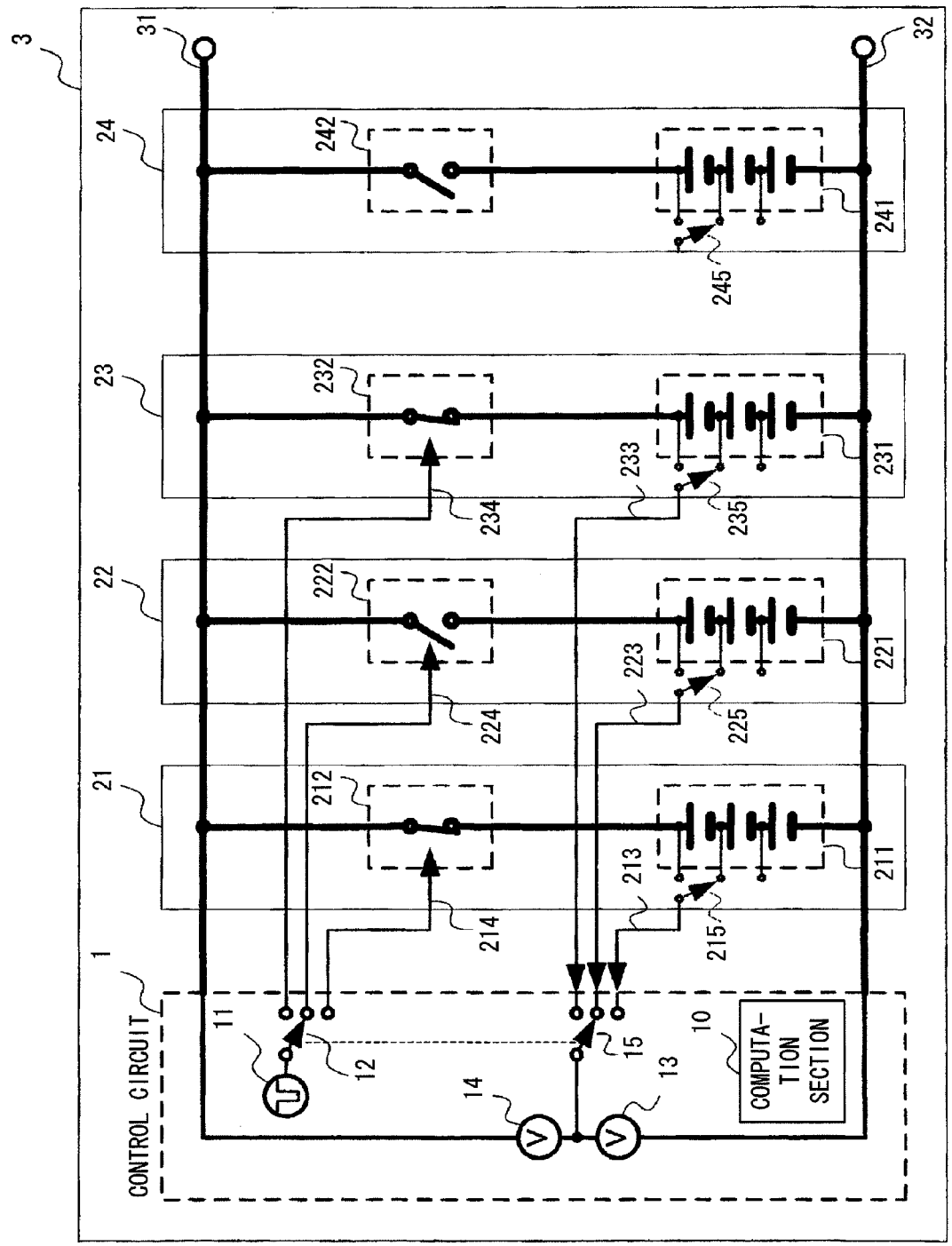
FIG. 6 is a wiring diagram for when, in the battery pack according to the first embodiment of the present invention, a cell group structural unit consists of three cells.

It should be understood that, while in FIG. 1 the number of secondary cells included in each of the cell groups 211, 221, 231, and 241 is shown as being one, it would also be acceptable to arrange for a plurality, being a small number, of secondary cells connected in series to be included in each of the cell groups 211, 221, 231, and 241. For example, as shown in the wiring diagram of FIG. 6, it would be possible to make each of the cell groups 211, 221, 231, and 241 by connecting three secondary cells in series. Furthermore, if cell groups that use a plurality of secondary cells in this manner are employed, then it would be acceptable to arrange to provide change over circuits 215, 225, 235, and 245, thus making it possible to measure the voltage of each of the secondary cells making up the cell groups. While this entails increase of the number of circuits and the number of wiring lines, there is the advantageous aspect that it is possible to perform diagnosis of the cells with finer resolution.

The operation during charging and discharging of the battery pack according to this embodiment will now be explained. During normal charging and discharging, the signal generation circuit 11 outputs signals to the battery units 21, 22, and 23 via the signal distribution circuit 12, in order to put the respective first current control elements 212, 222, and 232 into the on state. It should be understood that the first current control element 242 of the spare battery unit 24 is always turned off. In this state, for all of the battery units 21, 22, and 23 except for the spare battery unit 24, the respective cell groups 211, 221, and 231 are able to perform charging and discharging. Accordingly, it is possible to obtain the maximum charging and discharging output for the entire battery module 3.

Next, the theory of deterioration diagnosis of the cells in the battery pack according to this embodiment will be explained. Deterioration diagnosis of the cells can be performed by measuring the DC internal resistance value of each cell (hereinafter this will be termed "DCR", i.e. Direct Current Resistance). And the degree of deterioration of a secondary cell (i.e. the decrease in its capacity) can be expressed using its so-called value SoH (State of Health). The SoH is a value that expresses the magnitude of the current cell capacity in percent by taking the capacity of the cell when it is new as a reference, and the SoH decreases when the cell deteriorates.

Figure 7:
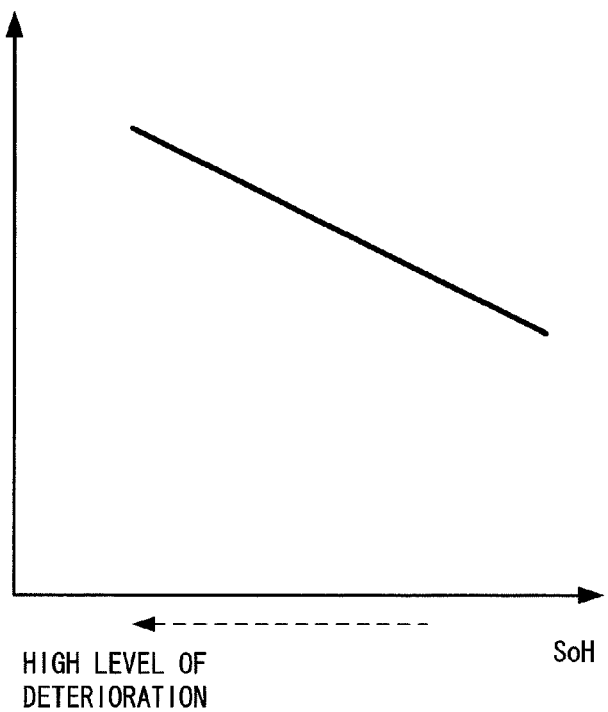
FIG. 7 is a figure showing the relationship between the SoH and the DCR of a secondary cell.

It is known that, generally, a relationship like that shown in FIG. 7 holds between the SoH and the DCR of a cell. It will be understood from FIG. 7 that it is possible to infer the degree of deterioration of a cell by measuring the DCR of the cell.

The DCR of a cell is obtained on the basis of the difference between the cell voltages that are measured in the state in which a charging/discharging current is flowing through the cell, and in the open circuit state in which the charging/discharging current is intercepted and no current is flowing. In concrete terms, if the cell voltage in the state in which a charging/discharging current I1 is flowing through the cell is termed V1, and the cell voltage in the state in which no charging/discharging current is flowing through the cell is termed V2, then the DCR may be calculated from the following Equation #1:

$$DCR = (V2 - V1)/I1 \quad \text{(Equation \#1)}$$

Next, the operation during deterioration diagnosis of the cells will be explained. In the following, the case will be explained in which, among the battery units 21, 22, and 23, the battery unit 22 has been selected by the signal generation circuit 11 and by the signal distribution circuit 12 as the subject for diagnosis, and diagnosis of the cell group 221 of the battery unit 22 is being performed. At this time, in the state in which charging/discharging current is being flowed through the battery units 21 and 23 other than the battery unit 22, the first current control element 222 of the battery unit 22 is put into the on state and into the off state by the signal generation circuit 11 and the signal distribution circuit 12. As a result, a charging/discharging current is flowed through the battery unit 22, and also is intercepted.

Figure 8:
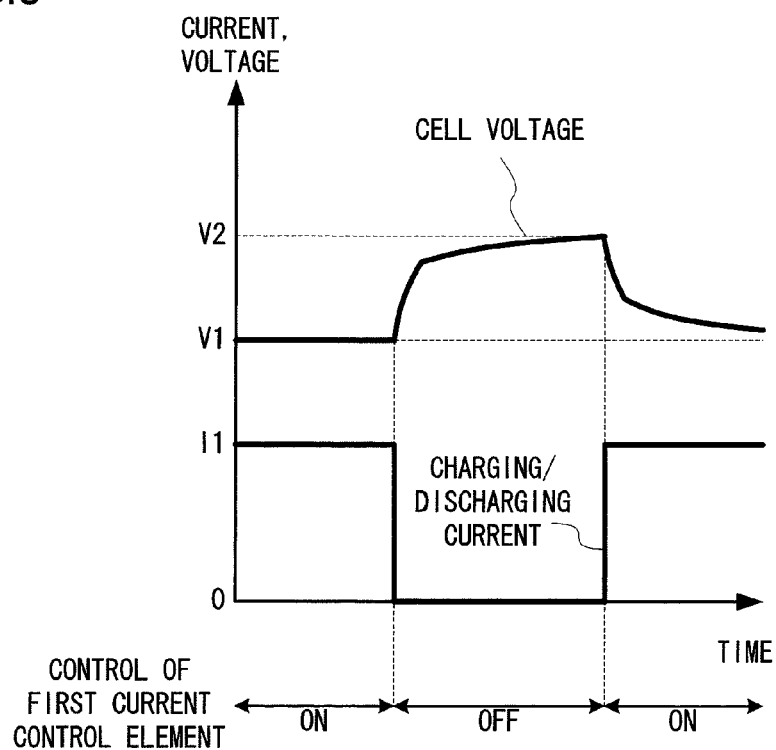
FIG. 8 is a figure for explaining the changes over time of the cell voltage and the charging/discharging current of a cell group that is the subject of diagnosis when performing deterioration diagnosis of the battery pack according to the first embodiment of the present invention.

FIG. 8 is a figure for explanation of the change over time of the cell voltage and the charging/discharging current of the cell group 221 when performing deterioration diagnosis for the battery pack of this embodiment. It should be understood that, as previously described, in this embodiment, the voltage measurement circuit 13 is used for measurement of the cell voltage, and the first current control element 222 is used for interception of the current.

Before diagnosis starts, since the first current control element 222 is in the on state, a charging/discharging current flows through the cell group 221. The voltage and the charging/discharging current of the cell group 221 are measured at this time. An example of the results of this measurement is shown in FIG. 8 by I1 and V1. It should be understood that the voltage of the cell group 221 may be measured using the voltage measurement circuit 13. On the other hand, the charging/discharging current may be measured by measuring the amount of voltage drop when the first current control element 222 is in the on state, in other words the voltage between its two ends, with the voltage measurement circuit 14, and by calculation by the computation section 10 on the basis of the result of this measurement. Or it would also be acceptable to provide a current sensor (not shown in the figures) for measuring the charging/discharging current, and to use the value measured thereby.

When the charging/discharging current flowing through the cell group 221 and its cell voltage at this time have been measured, a signal is outputted from the signal generation circuit 11 via the signal distribution circuit 12, and the first current control element 222 is changed over from the on state to the off state. Thereafter, when the voltage of the cell group 221 has stabilized after a predetermined time period has elapsed, this voltage is measured by the voltage measurement circuit 13. An example of the result of measurement is shown by V2 in FIG. 8.

After having measured as explained above the cell voltage V1 and the charging/discharging current I1 when a charging/discharging current is flowing, and the cell voltage V2 when the charging/discharging current has been intercepted, the DCR of the cell group 221 can be calculated by the computation section 10 according to Equation #1, on the basis of the results of these measurements. The DCR that has been calculated is used by the computation section 10 for diagnosing the deterioration level of the cell group 221. It should be understood that, after the cell voltage V2 has been measured, deterioration diagnosis is terminated and charging/discharging is resumed by turning the first current control element 222 on.

In the above explanation, the operation in the case of the battery unit 22 being the subject of diagnosis was described, but the same holds when diagnosing the other battery units 21 and 23. In other words, if the battery unit 21 is to be the subject of diagnosis, then, after having measured the charging/discharging current I1 flowing through the cell group 211 and the voltage V1 at this time, the first current control element 212 is changed over from the on state to the off state, and the cell voltage V2 is measured when the charging/discharging current has been intercepted. And the DCR of the cell group 211 is calculated on the basis of the results of these measurements, and thereby deterioration diagnosis is performed. Furthermore, if the battery unit 23 is to be the subject of diagnosis, then, after having measured the charging/discharging current I1 flowing through the cell group 231 and the voltage V1 at this time, the first current control element 232 is changed over from the on state to the off state, and the cell voltage V2 is measured when the charging/discharging current has been intercepted. And the DCR of the cell group 231 is calculated on the basis of the results of these measurements, and thereby deterioration diagnosis is performed.

It should be understood that deterioration diagnosis processing for each of the battery units 21, 22, and 23 is performed according to an order that is determined in advance, or the like. In other words, by controlling the operation of the first current control elements 212, 222, and 232 using the signal generation circuit 11 and the signal distribution circuit 12, the battery unit for which the current is to be intercepted, in other words the battery unit for which the first current control element is to be put into the off state, is limited to being a part of the whole, and deterioration diagnosis is performed for this battery unit. When the deterioration diagnosis is completed, the battery unit whose current is intercepted is changed over. By sequentially performing deterioration diagnosis for each of the battery units in this manner, it is possible to perform deterioration diagnosis for each of the battery units while performing charging and discharging, without greatly reducing the overall charging and discharging capability of the battery module 3.

Next the processing by which it is decided, as a result of having performed deterioration diagnosis as described above, that deterioration of some battery unit has proceeded to a certain fixed level or greater will be explained. FIG. 2 is a wiring diagram showing the wiring relationship in the battery pack of this embodiment when a battery unit has been disconnected and the spare battery unit has been connected. In the following explanation, the case will be considered in which, in the structure shown in FIG. 1, it has been decided for the battery unit 23 that deterioration has proceeded to a certain fixed level or greater.

Due to deterioration diagnosis such as described above, if the SoH of the cell group 231 of the battery unit 23 is less than or equal to a predetermined threshold value, in other words if the DCR that is calculated for the cell group 231 is greater than or equal to a predetermined value, then it is decided that the degree of deterioration of the cell group 231 is high and that it contains a bad cell. In this case, measures are adopted by the signal generation circuit 11 and the signal distribution circuit 12 to fix the signal to the first current control element 232 in the off state. As a result, the battery unit 23 is excluded as a subject for being charged and discharged, and is cut off from the main system of the battery module 3. Due to this operation, it is possible to prevent the deterioration of the cell group 231 from progressing further and bringing about a dangerous state with regard to anomalous generation of heat or the like.

When cutting off of the battery unit 23 that has deteriorated is performed as described above, the charging and discharging capacity of the battery module 3 as a whole is somewhat reduced. Thus, in this embodiment, in order to offset this, the spare battery unit 24 is incorporated into the subjects of being charged and discharged, instead of the battery unit 23 that has been cut off. As shown in FIG. 2, this operation can be implemented by, after having fixed the first current control element 232 of the battery unit 23 in the off state, outputting a signal via the wiring line 244 to the first current control element 242 of the spare battery unit 24 to put that current control element into the on state.

It should be understood that, when the spare battery unit 24 has been incorporated, it is possible to perform voltage measurement for the cell group 241 of the spare battery unit 24 and measurement of the voltage between the two ends of the first current control element 242 by the voltage measurement circuits 13 and 14 respectively via the wiring line 243. And it is possible to perform deterioration diagnosis for the spare battery unit 24 on the basis of the results of these measurements, in a similar manner to that for the other battery modules.

The deployment of the spare battery unit 24 such as explained above is particularly effective if, for example, a plurality of the battery modules 3 are connected in series, and it is desired to keep the capacity of each of the battery modules 3 constant. Or, in order to simplify the system, it would also be possible to provide a structure in which deployment of a spare battery unit 24 is omitted, and only disconnection of any bad battery unit that has been detected is performed, in which case the charging and discharging capacity of the battery module 3 as a whole becomes progressively reduced. In this case as well, by disconnecting battery units that are bad, it is possible to obtain the beneficial effect of ensuring security and reliability in the long term.

It should be understood that while, in this embodiment, in order to simplify the explanation, the number of battery units included in the battery module 3 has been supposed to be three, and the number of spare battery units has been supposed to be one, these battery unit numbers are not to be considered as being limited thereby. For example, it would also be acceptable to arrange to provide several tens or several hundreds of battery units, including the spares. The greater the number of battery units is, the higher is it possible to raise the efficiency of redundancy by deploying the spare battery units.

Furthermore, while in this embodiment an example has been explained in which back-to-back connected MOSFETs are used as the first current control elements 212, 222, 232, and 242, it would also be acceptable to use current control elements of some other type. It would be also possible to obtain similar beneficial operational effects as those explained above if MOSFETs in which reverse flow prevention countermeasures are implemented by methods other than the back-to-back connection, or bipolar transistors, IGBTs (Insulated Gate Bipolar Transistors), relays of various types, or the like are used.

Examples of MOSFETs in which reverse flow prevention countermeasures are implemented by methods other than the back-to-back connection will now be explained using FIGS. 13, 14, and 15.

Figure 13:
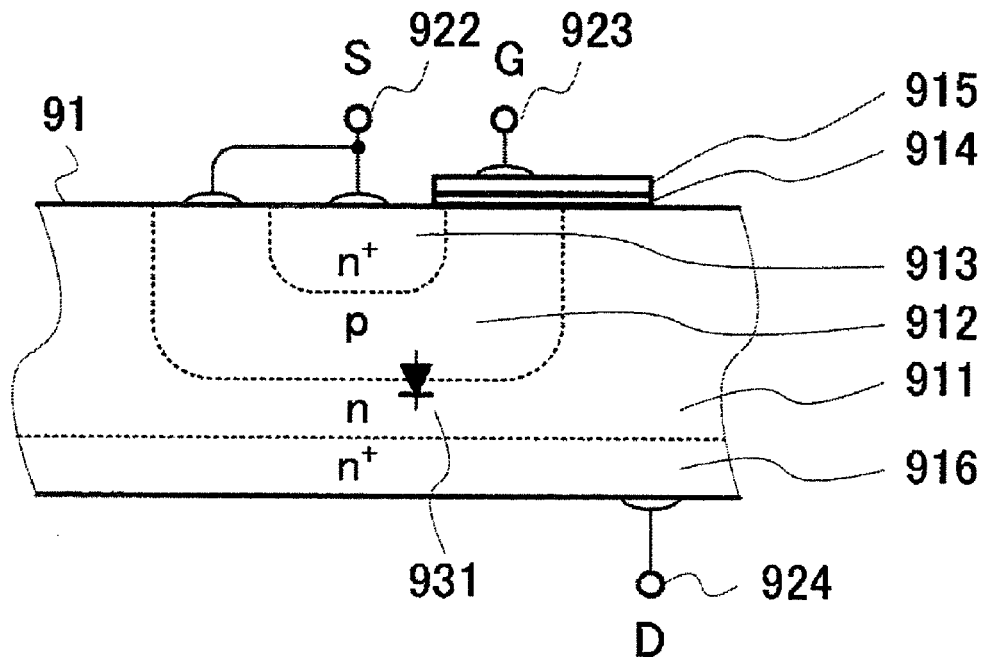
FIG. 13 is a figure showing the cross sectional structure of an N type transfer MOSFET of a conventional construction.

First, the cross sectional construction of an N type power MOSFET of a widely used type is shown in FIG. 13. This element is manufactured by processing a semiconductor wafer 91, with a source terminal 922, a gate terminal 923, and a drain terminal 924 being brought out to the exterior of the element, and with a p-well region 912 within the wafer being connected to the source terminal 922. Due to the p-well region being connected to the source terminal, the p-well region is not at floating potential, so that stable operation is possible; but since, as a side effect, a parasitic diode 931 is formed due to the p-n junction between the source terminal and the drain terminal, accordingly, if the source terminal goes to a higher voltage than the drain terminal, then this parasitic diode goes continuous, and control of the current becomes impossible, and this is undesirable.

Since it is necessary to control the current in both directions for controlling the charging and discharging current of the battery unit, accordingly, for using this element as a current control element, it is necessary to connect together the source terminals or the drain terminals of two MOSFETs (back-to-back connected MOSFETs), so that it is ensured that the parasitic diodes of both of them are not both on at the same time; and there are the problems that the cost is doubled, and that moreover the on resistance is doubled, both of which are undesirable.

Figure 14:
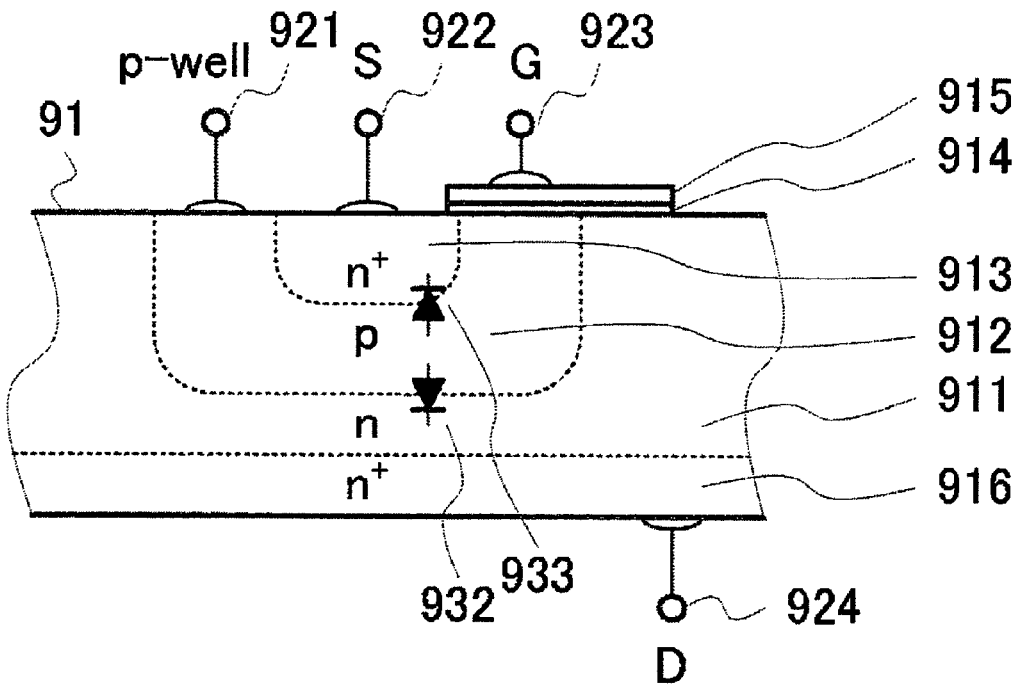
FIG. 14 is a figure showing the cross sectional structure of an N type transfer MOSFET.

On the other hand, the cross sectional construction of a so-called transfer MOSFET is shown in FIG. 14. Fundamentally the structure of a transfer MOSFET is the same as that of a conventional MOSFET, but its construction is different in the feature that no connection is made between the p-well region and the source terminal, but rather a dedicated terminal 921 is brought out for the p-well region. With this construction, parasitic diodes 932 and 933 are formed in a similar manner to a conventional MOSFET, but if, exterior to the element, the p-well terminal is connected to a lower potential than either the source terminal or the drain terminal, then these parasitic diodes 932 and 933 are not turned on. Due to this, it is possible to control the current in both directions with a single element if such a transfer MOSFET is used, and it is possible to reduce both the cost and the on resistance.

Figure 15:
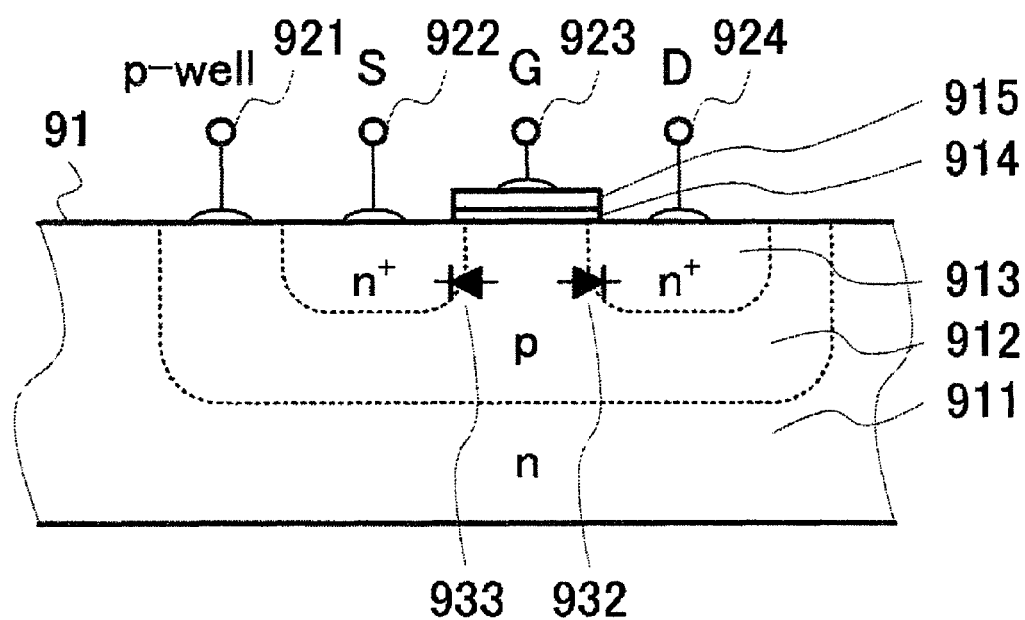
FIG. 15 is a figure showing the cross sectional structure of an N type transfer MOSFET of symmetric construction.

Furthermore, as another construction for this transfer MOSFET, as shown in FIG. 15, an example has also been considered in which an n+ region is added at one location and the drain terminal is brought out from this region, thus providing the source terminal and the drain terminal as a symmetric structure. With this structure, it is possible to control the current in both directions in a similar manner to the example shown in FIG. 14, and moreover there is the advantageous aspect that it is possible to obtain symmetric current/voltage characteristics thereof.

While the structure described above relates to an n type MOSFET, it would also be possible to build a transfer MOSFET with a p type MOSFET as well.

The Second Embodiment

Second embodiments of the battery pack according to the present invention and of the controller therefor will now be explained with reference to FIG. 3. In this embodiment, an example will be explained of performing deterioration diagnosis for the cells using a different method from that explained in the first embodiment. FIG. 3 is a wiring diagram showing the wiring relationship in a battery module 3, this being a battery pack according to this embodiment.

To compare with FIG. 1 that was used in the explanation of the first embodiment, the main difference of FIG. 3 is the feature that a second current control element and a discharge resistor for forced discharge, connected in parallel with the cell group, are provided to each battery unit, and the feature that a signal generation circuit 16 and a signal distribution circuit 17 are provided within the control circuit 1 for controlling the operation of these second current control elements. For example, in the battery unit 21, a second current control element 215 and a discharge resistor 216 are connected in parallel with the cell group 211. A control input terminal of the second current control element 215 is connected to the signal generation circuit 16 via a wiring line 217 and the signal distribution circuit 17, and thus the signal from the signal generation circuit 16 is inputted. This second current control elements 215 is kept in the off state by the signal generation circuit 16 during normal charging and discharging, so that unnecessary discharging is not performed. The same holds for the other battery units 22, 23, and 24.

Next, the operation of the battery pack according to this embodiment during cell deterioration diagnosis will be explained. It should be understood that, in this embodiment as well, the feature that diagnosis of deterioration of the cells is performed by measuring the DCRs of the cells is no different from the case with the first embodiment, as previously described. In this embodiment, the diagnosis of the cell group 221 of the battery unit 22 will be explained. The same also holds for the other battery units 21 and 23.

When performing deterioration diagnosis, the signal generation circuit 11 puts the first current control element 222 in the off state via the signal distribution circuit 12, and intercepts the charging/discharging current. In this state, the voltage measurement circuit 13 measures the open circuit voltage V1 of the cell group 221 via the changeover circuit 15. It should be understood that, at this time, the second current control element 225 is in the off state. Next, still in this state with the charging/discharging current intercepted, by putting the second current control element 225 in the on state for only a short interval, the signal generation circuit 15 forcibly causes electrical discharge from the cell group 221 to the discharge resistor 226. At this time, via the changeover circuit 15, the voltage measurement circuit 13 measures the voltage V2 of the cell group 221 under load. And, on the basis of the voltage values that have been measured in this manner and the resistance value (termed RL) of the discharge resistor 226, the DCR of the cell group 221 can be calculated by the computation section 10 using the following Equation #2, and the level of deterioration of the battery unit 22 can be diagnosed on the basis of the DCR that is thus calculated.

$$DCR=RL(V1/V2-1) \quad \text{(Equation \#2)}$$

In this embodiment, as compared to the method explained in connection with the first embodiment, there is the advantageous aspect that, in order to calculate the DCR, it is not necessary to measure the voltage value between the two ends of the first current control element, or the current flowing in it. Furthermore, if the resistance value RL is already known, it is possible to calculate the value of the DCR only by measuring the ratio between the open circuit voltage V1 and the voltage under load V2 (ratiometric). Accordingly, there is the advantageous aspect that no reference voltage of high accuracy is required, and it is possible to perform high accuracy measurement with a convenient circuit.

It should be understood that, in this embodiment as well, in a similar manner to the case with the first embodiment, if the result of diagnosis is that it is decided that deterioration has proceeded to a fixed level or further and that the battery unit must be considered as being a bad cell, then it is possible to perform cutting out of this bad cell and connection of a spare battery unit.

Now, in the first and second embodiments explained above, examples have been explained in which diagnosis of deterioration is not performed for the plurality of battery units simultaneously, but rather diagnosis is performed for only one battery unit, and normal charging and discharging are performed for the other battery units. However, when the entire battery module 3 is in an unused state, for example if starting processing or the like is being performed, then it is possible to perform the above described type of deterioration diagnosis for all of the battery units at the same time. Generally, with a battery, even in the open state in which current is intercepted, a long time period is needed for its voltage to stabilize. Due to this, the longer is the time period from when the first current control element is turned off until the open circuit voltage V1 of the cell group or the cells is measured, the more the accuracy of the measured value increases. Accordingly, it is possible to enhance the accuracy of diagnosis by turning off the first current control elements of all of the battery units when the battery module 3 is not being used, and by performing the subsequent processing after a fixed time period, or when usage of the battery module is to be resumed.

The Third Embodiment

Third embodiments of the battery pack according to the present invention and of the controller therefor will now be explained with reference to FIG. 4. With a battery pack and a controller therefor to which the present invention is applied, it is also possible to employ a structure in which fault diagnosis is performed, instead of the type of cell deterioration diagnosis previously described. In this embodiment, an example of performing this type of cell fault diagnosis will be explained. FIG. 4 is a wiring diagram showing the wiring relationship in a battery module 3, this being a battery pack according to this embodiment.

To compare with FIG. 1 that was explained in connection with the first embodiment, the main difference of FIG. 4 is the feature that the voltage measurement circuit 14 for measuring the voltages between the two ends of the first current control elements 212, 222, 232, and 242 is not provided.

Next, the theory during fault diagnosis of cells in a battery pack according to this embodiment will be explained. In this embodiment, fault diagnosis of the cells is performed by measuring the amount of self-discharge due to minute short circuits in the interior of each cell.

Generally, when the separators in the interior of a secondary cell deteriorate, or when lithium ions in the electrolyte precipitate out in the separators in the form of dendrites (arborescence) or the like, and when the insulation between the positive and negative electrodes progressively decreases, the influence thereof appears in the form of increase in the amount of self-discharge due to the reduction in insulation. If this decrease of insulation is ignored and charging and discharging are continued, then before long the dendrites pierce through the separators or the like so that the decrease of the insulation progresses rapidly, and there is a possibility that the situation will deteriorate to the extent that a dangerous state of affairs develops, such as anomalous heat generation in the cell or the like. In order to avoid this eventuality it is necessary, by monitoring the amount of self-discharge of each of the cells, and by stopping charging and discharging of any cell for which the amount of self-discharge is greater than a predetermined value so that it is decided to be faulty, and so on, to halt further progression of the decrease in the insulation of that cell.

Figure 9:
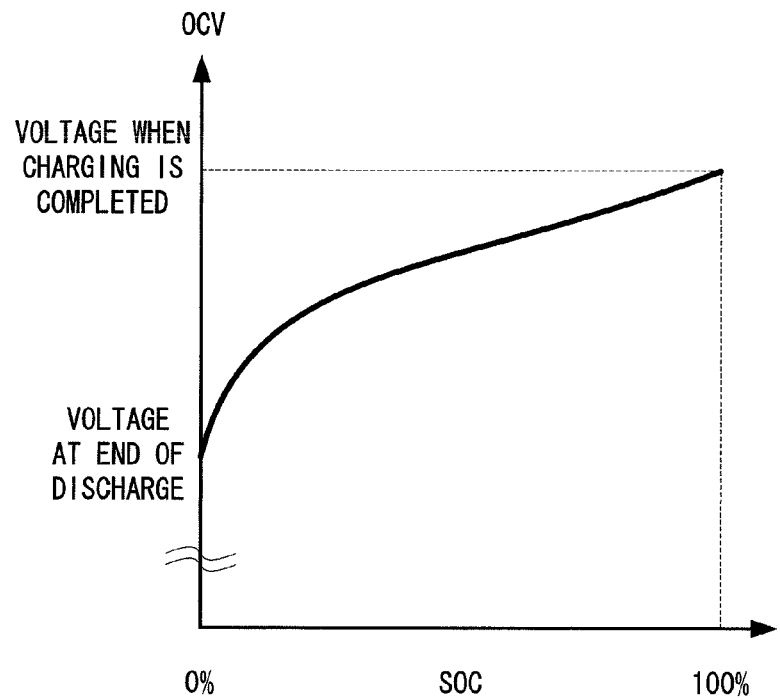
FIG. 9 is a figure showing the relationship between the SoC and the OCV of a secondary cell.

The amount of self-discharge of a cell can be inferred by measuring the decrease in the remaining capacity due to self-discharge in the state in which charging and discharging of the cell has stopped. FIG. 9 is a figure showing an example of the relationship between the SoC (State of Charge) of a secondary cell and the OCV (Open Circuit Voltage) of the cell when it is open circuited. The SoC is a value that gives the amount of electric charge that can currently be discharged (i.e. the integrated value of current over time) in percent, taking the amount when the cell is fully charged as a reference. It should be understood that the SoC when the cell is fully charged is 100%, while the SoC in the state of complete discharge is 0%. From the relationship shown in FIG. 4, it will be understood that it is possible to ascertain the remaining capacity of the cell by measuring the OCV of the cell.

Figure 10:
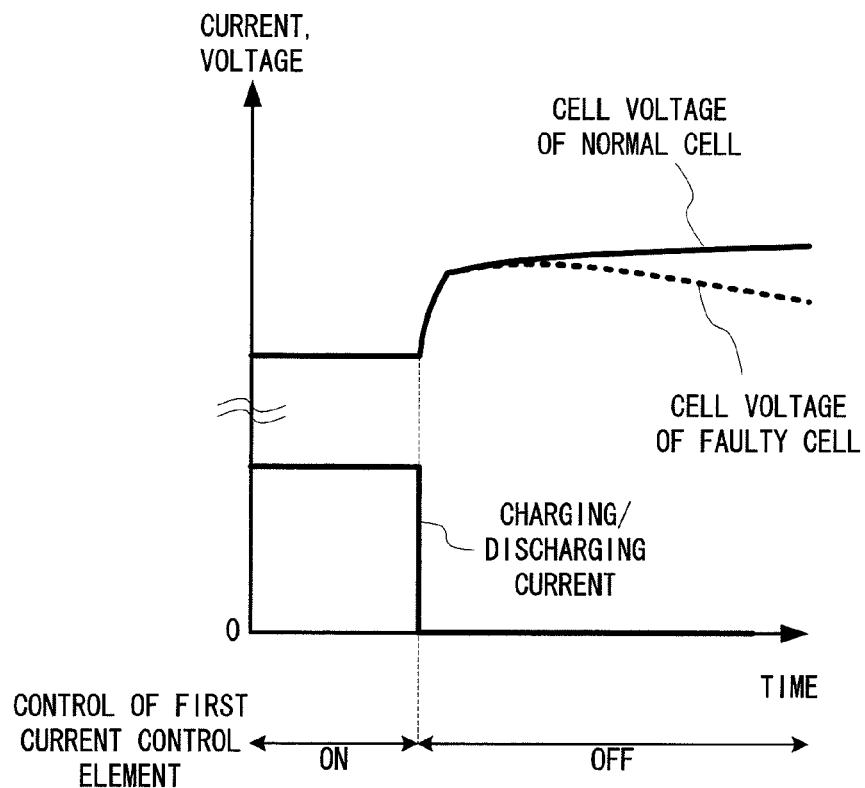
FIG. 10 is a figure showing, for a normal cell and for a faulty cell, examples of change of the cell voltage after current has been cut off.

With a modern lithium ion cell, if the cell is normal, the decrease of the SoC due to self-discharge is extremely small, for example of the order of 5% per month. However, if a minute short circuit occurs in the interior of the cell, then for example the SoC decreases due to self-discharge as shown by the dotted line in FIG. 10, and together therewith the OCV also decreases. FIG. 10 is a figure showing examples of the change of cell voltage after charging/discharging current has been cut off, for a normal cell and for a faulty cell whose amount of self-discharge has increased because a minute short circuit has occurred in its interior. It is possible to measure the amount of self-discharge by detecting this decrease of the OCV, and to detect that the cell is faulty from this measurement.

However, it is difficult to infer the amounts of self-discharge for each of the cell groups only from change of the cell voltages, since the value of the OCV does not converge if a long time period is not allowed after the cell current has stopped. Thus, in this embodiment, when performing fault diagnosis, the first current control elements of all of the battery units that are to be the subject of diagnosis are turned off together. By doing this, it becomes simple and easy relatively to compare together the OCV values of the cell groups even if the elapsed time is short, since it is possible to ensure that the elapsed time after turning off the current is the same for all of the cell groups that are the subject of diagnosis.

Now, it is known that the relationship between the SoC and the OCV is easily influenced by the temperature. Due to this, it is desirable to arrange the various battery units within the battery module so that they are positioned close to one another. If this is done, it is possible to ensure that the temperature differences between the various battery units are small. Or, if this type of arrangement is difficult, by measuring the actual temperature of each of the cells, and by using the values of OCV after having performed correction for these temperature differences in fault diagnosis, it is possible to obtain similar beneficial effects to arranging the various battery units as being positioned close to one another. According to these measurements, for the cell group that is the subject of diagnosis, by contrast to the fact that the cell voltages of normal cell groups generally change in the same way, the cell voltage of a cell group whose amount of self-discharge is large exhibits a tendency to diverge from the cell voltage of the other normal cell groups and to drop progressively. Due to this, by investigating the relative variation between the cell voltages, it becomes possible to detect any cell group whose amount of self-discharge is large as compared to the others, in other words any cell group that includes a cell that is experiencing a fault.

Next, the operation during fault diagnosis for a cell in the battery pack of this embodiment will be explained. In the following explanation, the case will be considered in which a minute short circuit 2311 has occurred in the interior of the cell group 231 of the battery unit 23.

When the entire battery module 3 is not being used, via the signal distribution circuit 12, the signal generation circuit 11 put the first current control elements 212, 222, and 232 of all the battery units 21, 22, and 23 that are to be the subjects of diagnosis into the off state, thus intercepting all the charging/discharging currents. In this state, the voltages of the cell groups 211, 221, and 231, in other words their OCVs, are measured using the voltage measurement circuit 13. By performing this type of processing at fixed intervals, or each time that restarting processing of the battery module is performed, the OCVs are measured for the cell groups 211, 221, and 231 a plurality of times.

On the basis of the values of the OCVs of the cell groups 211, 221, and 231 that have been measured a plurality of times as described above, the computation section 10 calculates the amount of dropping of the OCV of each of the cell groups 211, 221, and 231 of the battery units 21, 22, and 23. If the result is that there is some battery unit for which the amount of dropping of the OCV is large as compared to the other battery units, for example if there is some battery unit for which the difference from the average value of OCV dropping of all of the battery units is greater than or equal to some predetermined value, then it is decided that the cell group of that battery unit is faulty due to an excessively great amount of self-discharge. By doing this, fault diagnosis is performed for each of the cell groups 211, 221, and 231 of the battery units 21, 22, and 23.

It should be understood that, if there is some battery unit that has been determined as being faulty, then this battery unit may be excluded from the subjects of being charged and discharged, in a similar manner to the case with the battery unit that was determined as having deteriorated in the first and second embodiments. Furthermore, instead of this battery unit that has been excluded, a spare battery unit may also be deployed, and may be included as a subject for charging and discharging.

The Fourth Embodiment

Fourth embodiments of the battery pack according to the present invention and of the controller therefor will now be explained with reference to FIG. 5. In this embodiment, an example will be explained that is particularly useful when MOSFETs are used for the first current control elements 212, 222, 232, and 242. FIG. 5 is a wiring diagram showing the wiring relationship in a battery module 3, this being a battery pack according to this embodiment.

In comparison with FIG. 1 that was explained in connection with the first embodiment, the main differences of FIG. 4 are the feature that MOSFETs are explicitly used for the first current control elements 212, 222, 232, and 242, and the independent feature that the signal generation circuits 111, 112, and 113 that generate signals for controlling the first current control elements 212, 222, and 232 respectively are able to apply dedicated pulse signals to them. It should be understood that, when one of the battery units 21, 22, or 23 has been cut out of circuit and the spare battery unit 24 has been deployed instead, the one of the signal generation circuits 111, 112, or 113 that was outputting a pulse signal to the first current control element of that battery unit up to this time point now outputs a pulse signal to the first current control element 242 of the spare battery unit 24 that has been deployed.

It should be understood that while, in FIG. 4, an example is shown in which this embodiment is applied to the battery module 3 according to the first embodiment, it would also be possible to apply this embodiment to the battery module 3 according to the second or the third embodiment as well. By applying this embodiment, it is possible to control the first current control elements 212, 222, 232, and 242 using the signal generation circuits 111, 112, and 113 in a more flexible manner.

In the first, second, and third embodiments described above, during normal charging and discharging, in other words in the state in which charging or discharging of the battery units 21, 22, and 23 is being performed, all of the cell groups 211, 221, and 231 are connected in parallel. Due to this, when there is variation in the values of DCR or OCV between the cell groups 211, 221, and 231, the charging/discharging currents become unequal, and the charging/discharging current becomes concentrated in some specified portion of the cell groups. Generally, with a secondary cell, the maximum charging and discharging currents are stipulated, and it is necessary not to exceed these values. However, if the current becomes concentrated in a specific cell group, then, when this reaches the maximum charging/discharging current, it becomes impossible to increase the current for the battery module 3 as a whole further, even if the charging/discharging current in the other cell groups has not yet reached the maximum charging/discharging current. As a result, the maximum output of the battery module 3 as a whole decreases, and this is undesirable.

Thus, by applying this embodiment to the first, second, or third embodiment, each of the PWM signals is generated from the signal generation circuit 111, 112, and 113 respectively according to the charging/discharging current of each cell group, and the proportion of the time that each of the first current control elements 212, 222, and 232 is put into the on state is controlled. Due to this, the charging/discharging currents for the cell groups 211, 221, and 231 can be made uniform between the various battery units 21, 22, and 23, so that it is possible to solve the type of problem described above.

Furthermore, depending upon the application of the battery module 3, in some cases the expected life of the battery module is much more important than its maximum output. In this type of case, it is also possible to control the proportion of the time that each of the first current control elements 212, 222, and 232 is in the on state according to the result of diagnosis of deterioration level for each of the cell groups by the deterioration diagnosis explained in connection with the first and second embodiments. Due to this, it is possible to adjust the charging/discharging currents of the cell groups 211, 221, and 231 between the battery units 21, 22, and 23, and thereby it may be contemplated to make the deterioration levels uniform. In other words, if the result of the deterioration diagnosis is that there is some cell group for which the degree of progression of deterioration is high as compared with the other cell groups, then, by using control by the PWM signal from the signal generation circuit 111, 112, or 113 for that cell group, its charging/discharging current is lightened as compared to those of the other cell groups. Due to this, it is possible to delay the progression of deterioration of that cell group.

It should be understood that, if MOSFETs are used for the first current control elements 212, 222, 232, and 242, then the PWM control explained above is particularly useful, since its responsiveness is fast. If current control elements of some other type are used, for example bipolar transistors, IGBTs, or relays of various types, then it is possible to perform control at a control speed that corresponds to their responsiveness, using PWM control or some other control method. In any of these cases, it is also possible to obtain similar beneficial effects.

Figure 11:
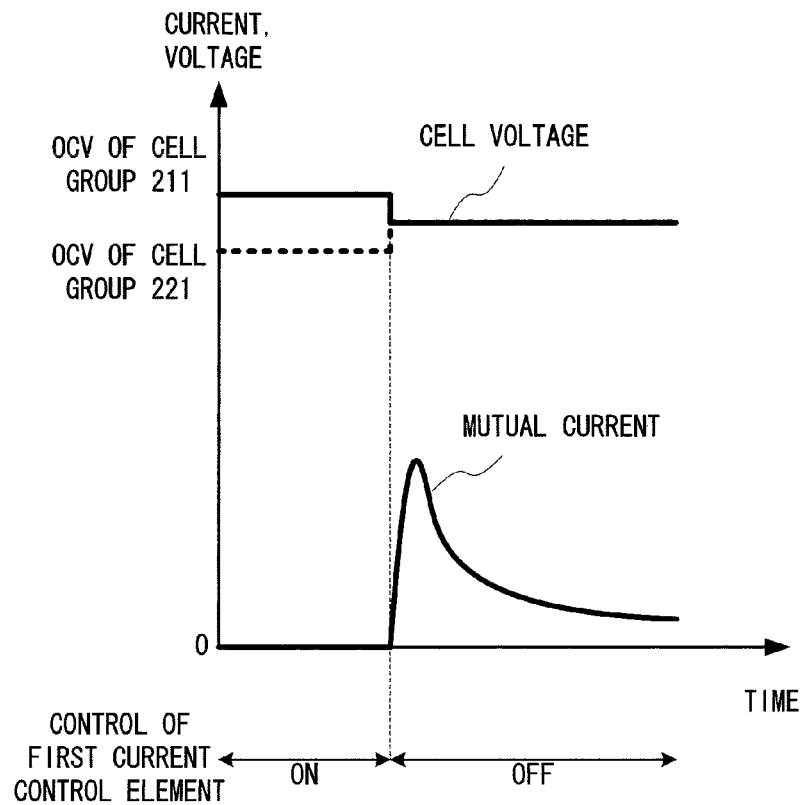
FIG. 11 is a figure showing change of the mutual current that flows between cells whose OCV is different, when those cells are connected in parallel.

Furthermore, as another problem with the first, second, and third embodiments, if due to deterioration diagnosis or fault diagnosis the first current control element 212, 222, or 232 of one of the cell groups has been put into the off state and accordingly that cell group has been temporarily cut off from the main system, then, when that cell group is reconnected again, due to mutual variation of the OCVs between the cell groups 211, 221, and 231, in some cases a large mutual current flows between the battery units 21, 22, and 23, as shown in FIG. 11. FIG. 11 is a figure relating to a case, by way of example, in which there is variation between the OCVs of the two cell groups 211 and 221, and shows the change of the mutual current flowing through these two cell groups when they are connected in parallel.

The mutual current as shown in FIG. 11 flows as superimposed upon the charging/discharging current of the battery module 3 as a whole. It is necessary to ensure that the total current of this charging/discharging current and the mutual current does not exceed the maximum charging/discharging current for each of the cell groups. While techniques may be considered for alleviating the mutual current by inserting resistances for current limitation in series with the cell groups and so on, since with such techniques the losses also undesirably become greater when performing normal charging and discharging, accordingly they entail decrease of the charging and discharging efficiency, and this is not desirable.

Thus, by applying this embodiment to the first, second, or third embodiment, and by using MOSFETs for the first current control elements, it is possible to take advantage of the constant current characteristic of the MOSFETs (i.e. their current saturation characteristic). Due to this, it is possible to resolve the problematic aspect described above.

Figure 12:
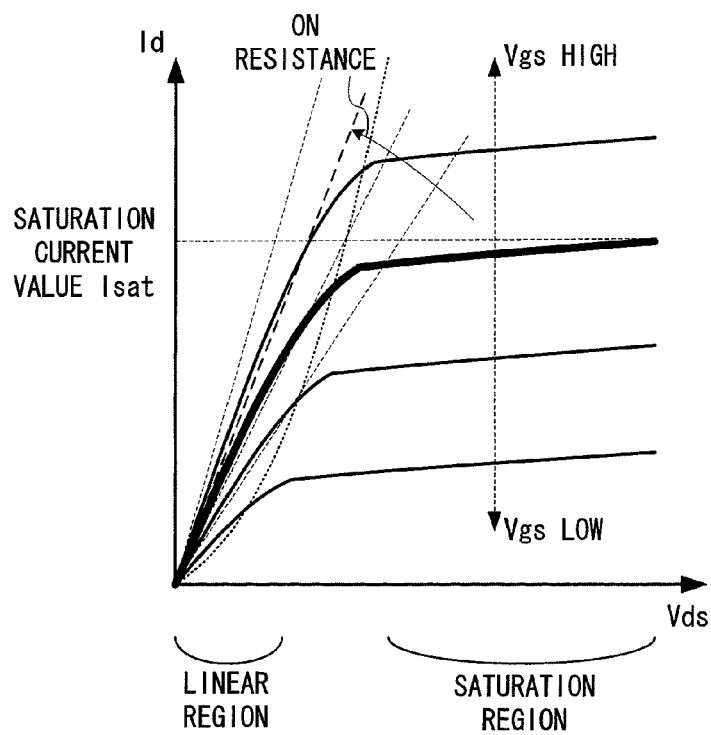
FIG. 12 is a figure showing the current/voltage characteristic of a MOSFET.

In the following, the theory and operation of current limitation using MOSFETs will be explained. FIG. 12 is a figure showing the relationship between Vds (the voltage between the drain and the source) and Id (the drain current) of a MOSFET, for various values of Vgs (the voltage between the gate and the source). It should be understood that control of the MOSFET may be performed by adjusting the value of Vgs.

First, a case will be considered in which the charging/discharging current of the battery unit is sufficiently small. When Vgs has some value, for example the value shown by the thick line in FIG. 12, in the region in which Id is sufficiently lower than the intrinsic saturation current value Isat corresponding to this value of Vgs (i.e. in which Id<<Isat), Vds increases almost proportionally to the increase of Id. In other words, in this region (the linear region), the MOSFET behaves as a resistor having a low resistance value. And, since the values of Id and Vds are both low in this linear region, the loss caused by the MOSFET is small. Accordingly, normal charging and discharging are performed in this linear region.

Next, a case will be considered in which an excessively great current flows in the battery unit (i.e. Id≈Isat). In the region in which Id is close to the saturation current value Isat, abruptly the electrical conductivity of the MOSFET decreases and Vds increases, and Id increases almost no further above this level. In other words, the MOSFET exhibits a constant current characteristic in this region (the saturation region), and the current is limited so that it remains less than or equal to the saturation current value Isat corresponding to the value of Vgs.

When the nature of a MOSFET as described above is taken advantage of, the loss is small during normal charging and discharging, and moreover, if an excessively great current tries to flow when a cell group is reconnected or the like, it is possible to implement operation to limit the current automatically, without using any special processing or control. It should be understood that, if this characteristic is to be taken advantage of, then it is necessary to adjust in advance the voltages of the signals that the signal generation circuits 111, 112, and 113 output when turning the first current control elements 212, 222, and 232 on respectively. This adjustment may be performed according to the maximum charging/discharging currents for the cell groups 211, 221, and 231, and according to the characteristics of the MOSFETs that are used for the respective first current control elements 212, 222, and 232.

With limitation of maximum current by taking advantage of the constant current characteristics of MOSFETs as described above, there is no need for the signal generation circuits 111, 112, and 113 necessarily to generate PWM signals as this embodiment. Even if PWM signals are not employed, as explained in connection with the first, second, and third embodiments, it is still possible to obtain similar beneficial effects to those explained in connection with this embodiment by adjusting in advance the output voltage for the on state by the signal generation circuit 11, as described above.

It should be understood that while, in the various embodiments described above, battery modules 3 that included a control circuit 1, battery units 21, 22, and 23, and a spare battery unit 24 were explained as examples of the battery pack according to the present invention, it would also be acceptable to arrange to include the control circuit 1 in a different structure from that of the battery pack. In this case, the battery units 21, 22, and 23 and the spare battery unit 24 would be included in a battery pack, and the control device 1 could be used as a controller for that battery pack.

Furthermore, in the embodiments described above, examples were described in which the computation section 10 was provided within the control circuit 1, and diagnosis of deterioration level or faults for the various battery units 21, 22, and 23 was performed by this computation section 10. However, it would also be acceptable to provide the computation section 10 separately from the control circuit 1. In this case, it is desirable mutually to transmit and receive between the control circuit 1 and the computation section 10 signals that specify the results of voltage measurement by the voltage measurement circuits 13 and 14 and signals for controlling the operation of the signal generation circuits 11 and 16, the signal distribution circuits 12 and 17, the changeover circuit 15 and so on.

Provided that the essential characteristics of the present invention are not lost, the present invention is not to be considered as being limited by any of the embodiments described above.

EXPLANATION OF THE REFERENCE SYMBOLS

1: control circuit; 11, 16: signal generation circuits; 12, 17: signal distribution circuits; 13, 14: voltage measurement circuits; 15: changeover circuit; 21, 22, 23: battery units; 24: spare battery unit; 211, 221, 231, 241: cell groups; 212, 222, 232, 242: first current control elements; 215, 225, 235, 245: second current control elements; 216, 226, 236, 246: discharge resistors; 3: battery module.

The invention claimed is:
1. A battery pack that is electrically connected to a load, and that performs charging and discharging between the load, comprising:
   a plurality of battery units mutually connected in parallel, each including a cell group in which one or two or more secondary cells are connected in series, and a first current control element that is connected in series with the cell group;
   a first control unit that controls the charging/discharging current for each battery unit by controlling the operation of the first current control element included in each of the battery unit;

a voltage measurement unit that measures the voltage of the cell group or cells included in each of the battery unit; and a diagnosis unit that diagnoses a deterioration level or a fault of each battery unit on the basis of the voltage of the cell group or cells measured by the voltage measurement unit, wherein the diagnosis unit calculates the DC internal resistance value of each battery unit on the basis of the voltage under load of the cell group or cells measured by the voltage measurement unit when the first control unit turns the first current control element on and the charging/discharging current is flowing to the load, on the basis of the charging/discharging current, and on the basis of the open circuit voltage of the cell group or cells measured by the voltage measurement unit when the first control unit turns the first current control element off and intercepts the charging/discharging current, and thereby diagnoses the deterioration level of each battery unit on the basis of the results of this calculation; and wherein:

each of the battery units further includes a second current control element and a discharge resistor for forced discharge, connected in parallel with the cell group;

the battery pack further comprises a second control unit that controls the operation of the second current control element possessed by each of the battery units; and the diagnosis unit calculates the DC internal resistance value of each battery unit on the basis of the open circuit voltage of the cell group or cells measured by the voltage measurement unit when, in the state in which the first control unit turns the first current control element off and intercepts the charging/discharging current, the second control unit turns the second current control element off, on the basis of the voltage under load of the cell group measured by the voltage measurement unit when the second control unit turns the second current control element on, and on the basis of the resistance value of the discharge resistor, and thereby diagnoses the deterioration level of each battery unit on the basis of the results of this calculation.

2. A battery pack according to claim 1, wherein:
the first control unit selects a partial battery unit from among the plurality of battery units, and, in the state in which the charging/discharging current is flowing through each of the battery units other than the selected battery unit, flows and intercepts the charging/discharging current through the selected battery unit; and the diagnosis unit diagnoses the deterioration level of the battery unit that has been selected by the first control unit.

3. A battery pack according to claim 1, wherein
the diagnosis unit calculates the charging/discharging current on the basis of the voltage between the two ends of the first current control element that has been turned on by the first control unit, and calculates the DC internal resistance value of each battery unit using the results of this calculation.

4. A battery pack according to claim 1, wherein
the first control unit adjusts the charging/discharging current between the battery units on the basis of the result of diagnosis of the deterioration level by the diagnosis unit.

5. A battery pack according to claim 1, wherein
the diagnosis unit calculates the amount of dropping of the open circuit voltage of each battery unit on the basis of the voltage of the cell group or cells measured a plurality of times by the voltage measurement unit when the first control unit turns all of the first current control elements off and intercepts the charging/discharging currents, and thereby diagnoses the fault of each battery unit on the basis of the results of this calculation.

6. A battery pack according to claim 1, wherein,
for a battery unit whose deterioration level diagnosed by the diagnosis unit is greater than or equal to a predetermined threshold value, or for a battery unit that has been diagnosed as being faulty by the diagnosis unit, the first control unit turns the first current control element off and cuts it off from the subjects of charging and discharging.

7. A battery pack according to claim 6, further comprising a number of spare battery units fewer than the number of the plurality of battery units, connected in parallel with the plurality of battery units, and that have the cell group and the first current control element, wherein, by turning the first current control elements of a portion of the spare battery units on, the first control unit incorporates the portion of the spare battery units in the subjects of charging and discharging, instead of the battery unit that has been cut off from the subjects of charging and discharging.

8. A battery pack according to claim 1, wherein
the first control unit controls each of the first current control elements of the battery units so as to make the charging/discharging currents uniform between the battery units.

9. A battery pack according to claim 8, wherein
the first control unit controls the proportion of time that the first current control element of each of the battery units is turned on by using PWM control.

10. A battery pack according to claim 1, wherein
the first current control element is built using a MOSFET that has constant current characteristic, and the charging/discharging current of the battery unit is limited by using the constant current characteristic.

11. A battery pack controller for a battery pack that comprises a plurality of battery units mutually connected in parallel, each including a cell group in which one or two or more secondary cells are connected in series, and a first current control element that is connected in series with the cell group, the battery pack being electrically connected to a load and performing charging and discharging between the load, comprising:

a first control unit that controls the charging/discharging current for each battery unit by controlling the operation of the first current control element included in each of the battery unit;

a voltage measurement unit that measures the voltage of the cell group or cells included in each of the battery unit; and a diagnosis unit that diagnoses a deterioration level or a fault of each battery unit on the basis of the voltage of the cell group or cells measured by the voltage measurement unit, wherein the diagnosis unit calculates the DC internal resistance value of each battery unit on the basis of the voltage under load of the cell group or cells measured by the voltage measurement unit when the first control unit turns the first current control element on and the charging/discharging current is flowing to the load, on the basis of the charging/discharging current, and on the basis of the open circuit voltage of the cell group or cells measured by the voltage measurement unit when the first control unit turns the first current control element off and intercepts the charging/discharging current, and thereby diagnoses the deterioration level of each battery unit on the basis of the results of this calculation; and wherein:

each of the battery units further includes a second current control element and a discharge resistor for forced discharge, connected in parallel with the cell group;

the controller further comprises a second control means unit that controls the operation of the second current control element possessed by each of the battery units; and the diagnosis unit calculates the DC internal resistance value of each battery unit on the basis of the open circuit voltage of the cell group or cells measured by the voltage measurement unit when, in the state in which the first control unit turns the first current control element off and intercepts the charging/discharging current, the second control unit turns the second current control element off, on the basis of the voltage under load of the cell group measured by the voltage measurement unit when the second control unit turns the second current control element on, and on the basis of the resistance value of the discharge resistor, and thereby diagnoses the deterioration level of each battery unit on the basis of the results of this calculation.

12. A battery pack controller according to claim 11, wherein the diagnosis unit calculates the amount of dropping of the open circuit voltage of each battery unit on the basis of the voltage of the cell group or cells measured a plurality of times by the voltage measurement unit when the first control unit turns the first current control element off and intercepts the charging/discharging current, and thereby diagnoses the fault of each battery unit on the basis of the results of this calculation.

13. A battery pack according to claim 1, wherein the first current control elements employ transfer MOSFETs.

14. A battery pack controller according to claim 11, wherein the first current control elements employ transfer MOSFETs.

* * * * *